(12) United States Patent
Zhang

(10) Patent No.: US 11,101,419 B2
(45) Date of Patent: Aug. 24, 2021

(54) PACKAGE STRUCTURE OF LIGHT-EMITTING DIODE AND METHOD FOR PACKAGING LIGHT-EMITTING DIODE

(71) Applicant: SHENZHEN YONG YU PHOTOELECTRIC CO, LTD, Shenzhen (CN)

(72) Inventor: Yong-Bing Zhang, Shenzhen (CN)

(73) Assignee: SHENZHEN YONG YU PHOTOELECTRIC CO, LTD, Shenzhen (CN)

( * ) Notice: Subject to any disclaimer, the term of this patent is extended or adjusted under 35 U.S.C. 154(b) by 88 days.

(21) Appl. No.: 16/673,945

(22) Filed: Nov. 4, 2019

(65) Prior Publication Data

US 2021/0135073 A1 May 6, 2021

(51) Int. Cl.
*H01L 33/62* (2010.01)
*H01L 33/60* (2010.01)
*H01L 33/56* (2010.01)

(52) U.S. Cl.
CPC .............. *H01L 33/62* (2013.01); *H01L 33/56* (2013.01); *H01L 33/60* (2013.01); *H01L 2933/005* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 2010/0230696 A1* | 9/2010 | Fukunaga | H01L 23/3142 257/98 |
| 2018/0033932 A1* | 2/2018 | Beh | H01L 33/62 |
| 2020/0227373 A1* | 7/2020 | Song | H01L 33/54 |

\* cited by examiner

*Primary Examiner* — Bradley Smith
*Assistant Examiner* — Kien C Ly
(74) *Attorney, Agent, or Firm* — Idea Intellectual Limited; Margaret A. Burke; Sam T. Yip

(57) ABSTRACT

A package structure of light-emitting diode includes a conductive chip-bonding base board, a conductive wire-bonding base board, a light-emitting diode chip, a first wire, a second wire, and a transparent glue bulk. The light-emitting diode chip is electrically connected to the chip-bonding base board and the wire-bonding base board via the first wire and the second wire. The transparent glue bulk wraps the light-emitting diode chip, the first wire, and the second wire. The transparent glue bulk forms a light-guide structure extending through the gap between the chip-bonding base board and the wire-bonding base board, such that both of the two side surfaces of the package structure of light-emitting diode are able to emit light.

6 Claims, 4 Drawing Sheets

PACKAGE STRUCTURE OF LIGHT-EMITTING DIODE AND METHOD FOR PACKAGING LIGHT-EMITTING DIODE

BACKGROUND

Technical Field

This disclosure relates to optoelectronic components, in particular to a package structure of a light-emitting diode and a method for packaging the light-emitting diode.

Related Art

A light-emitting diode device is a solid-state semiconductor device for transforming electric into light. The light-emitting diode device includes a semiconductor chip. The negative electrode of the chip is connected on a metal frame, while a positive electrode of the chip is electrically connected to a power source. The chip is packaged by transparent glue. The chip includes a P-type semiconductor and a-type semiconductor bonded to each other. When current is provided to the chip via a circuit, the chip emits light.

The chip is required to be protected, so as to keep away from dust, humidity, electrostatic discharge (ESD), and mechanical damages. When current is provided and the chip emits light, heat generated within the P—N semiconductors has to be removed, so as to prevent the chip from being overheated. New materials and new package structures are continuously developed in the art to enhance heat dissipation for the chip.

FIG. 1, FIG. 2, and FIG. 3 show a package structure 1 of light-emitting diode in the art. The package structure 1 includes a bismaleimide triazine printed circuit board 2 (BT-PCB) as shown in FIG. 1, a light-emitting diode chip 3 (LED chip), a first wire 4, a second wire 5, and a transparent glue bulk 6. As shown in FIG. 1, the BT-PCB 2 includes an insulation layer 2a and two copper layers 2b. The two copper layers 2b are etched to form a chip-bonding pad 2c, a wire-bonding pad 2d, and two welding pads 2e as shown in FIG. 2. As shown in FIG. 2, LED chip 3 is disposed on the chip-bonding pad 2c, and a first wire 4 and a second wire 5 respectively connect two electrodes of the LED chip 3 to the chip-bonding pad 2c and the wire-bonding pad 2d.

As shown in FIG. 3, transparent glue bulk 6, made of epoxy resin or silicone, wraps the LED chip 3, the first wire 4, and the second wire 5, so as to protect the LED chip 3. Shielded by the BT-PCB 2, the beam angle of the package structure 1 cannot be larger than 180 degree.

SUMMARY

This disclosure provides a package structure of a light-emitting diode and a method for packaging the light-emitting diode.

An embodiment of this disclosure a package structure of a light-emitting diode comprises a conductive chip-bonding base board, a conductive wire-bonding base board, a light-emitting diode chip, a first wire, a second wire, and a transparent glue bulk.

The chip-bonding base board includes a first bottom surface and a first bottom surface, a first glue trough is formed on the first bottom surface, and the first glue trough is opened at a first edge of the first bottom surface. The wire-bonding base board includes a second top surface and a second bottom surface, a second glue trough is formed on the second bottom surface, and the second glue trough is opened at a second edge of the second bottom surface. The chip-bonding base board and the wire-bonding base board are arranged adjacent to each other, a gap is formed between the first edge and the second edge, and the first bottom surface and the second bottom surface are coplanar. The light-emitting diode chip is disposed on the first top surface of the chip-bonding base board, and the light-emitting diode chip includes a first electrode and a second electrode. The first wire has two ends respectively bonded to first electrode and the first top surface. The second wire has two ends respectively bonded to the second electrode and the second top surface; and The transparent glue bulk at least covers parts of the first top surface and the second top surface, and wraps the light-emitting diode chip, the first wire, and the second wire. The transparent glue bulk further extends through gap and fills the first glue trough and the second glue trough.

An embodiment of this disclosure provides a method for packaging the light-emitting diode, comprising:

providing a conductive chip-bonding base board; wherein the chip-bonding base board includes a first bottom surface and a first bottom surface, a first glue trough is formed on the first bottom surface, and the first glue trough is opened at a first edge of the first bottom surface;

providing a conductive wire-bonding base board and arranging the chip-bonding base board and the wire-bonding base board to be adjacent to each other; wherein the wire-bonding base board includes a second top surface and a second bottom surface, a second glue trough is formed on the second bottom surface, and the second glue trough is opened at a second edge of the second bottom surface; wherein a gap is formed between the first edge and the second edge, and the first bottom surface and the second bottom surface are coplanar;

disposing a light-emitting diode chip on the first top surface of the chip-bonding base board; wherein the light-emitting diode chip includes a first electrode and a second electrode;

bonding two ends of a first wire to the first electrode and the first top surface, and bonding two ends of a second wire to the second electrode and the second top surface; and providing a transparent glue bulk to cover at least parts of the first top surface and the second top surface, and wrap the light-emitting diode chip, the first wire, and the second wire, and further having the transparent glue bulk extending through the gap and filling the first glue trough and the second glue trough.

The transparent glue bulk serves as a light guide structure to guide light emitted by the light-emitting diode chip to pass through the gap and leave the package structure from the first glue trough and second glue trough. Therefore, two sides of the package structure emit light to form an almost 360 degree beam angle.

BRIEF DESCRIPTION OF THE DRAWINGS

The present invention will become more fully understood from the detailed description given herein below for illustration only, and thus not limitative of the present invention, wherein.

DETAILED DESCRIPTION

Figure 1:
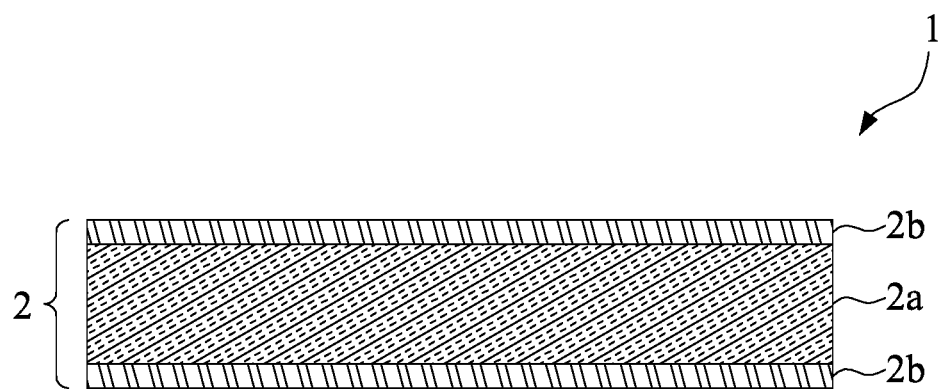
FIG. 1 is a package structure of light-emitting diode without the transparent glue bulk in the art.
Figure 2:
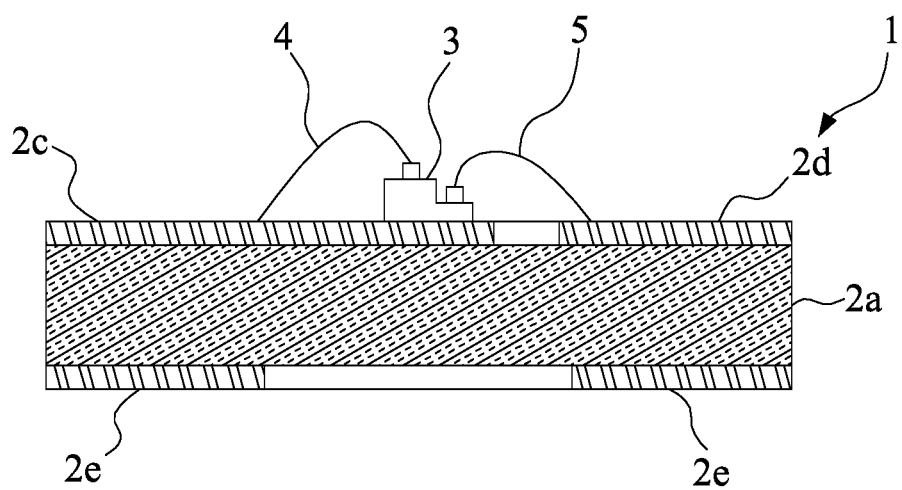
FIG. 2 is a package structure of light-emitting diode with the transparent glue bulk in the art.
Figure 3:
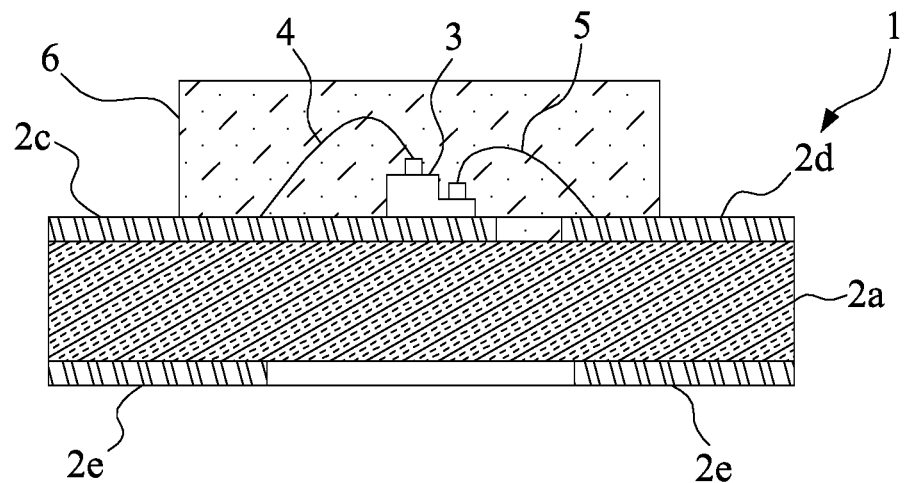
FIG. 3 is a cross-section view of the BT-PCB in the art.
Figure 4:
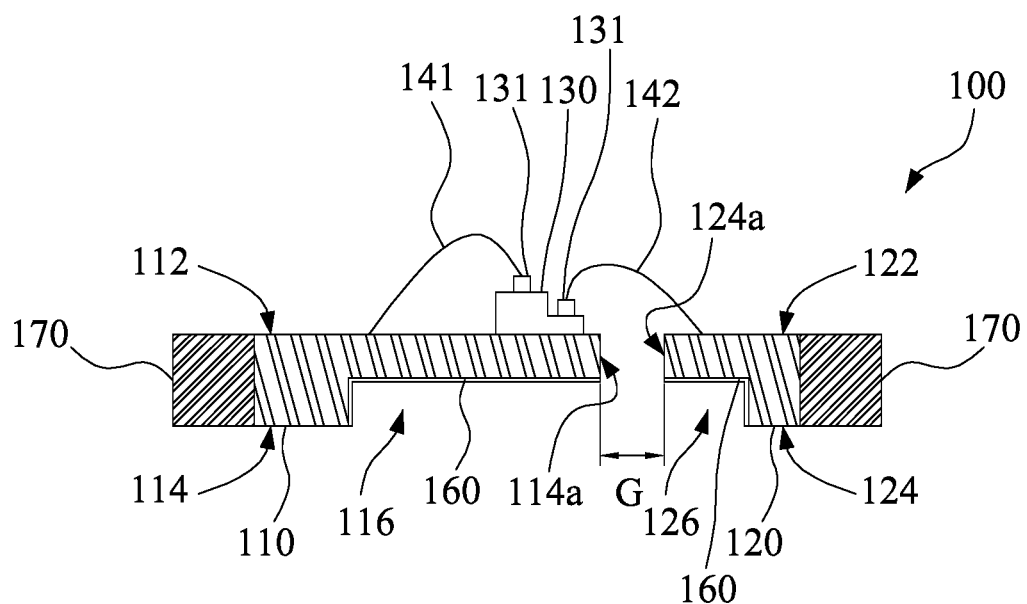
FIG. 4 is a package structure of light-emitting diode without the transparent glue bulk according to an embodiment of this disclosure.
Figure 5:
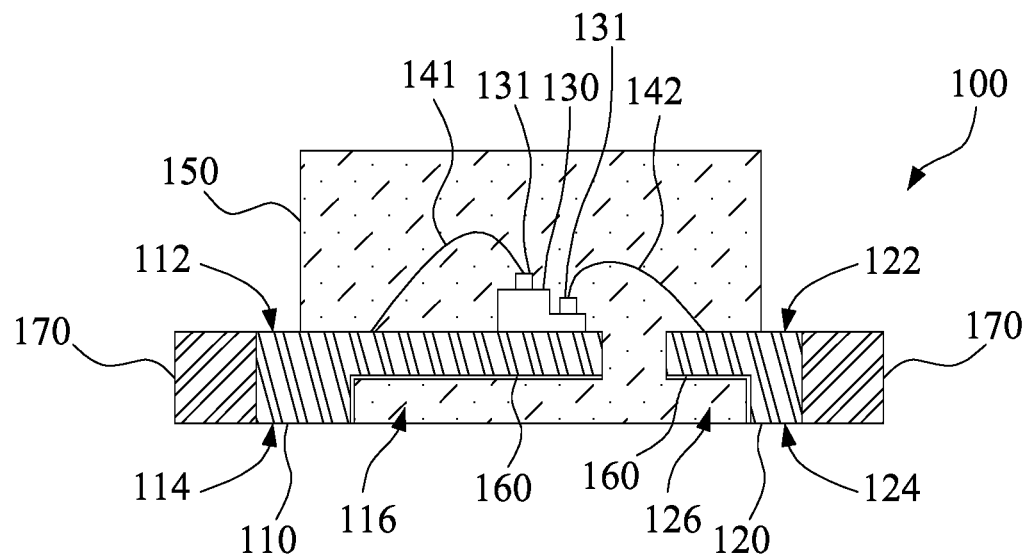
FIG. 5 is a package structure of light-emitting diode with the transparent glue bulk according to the embodiment of this disclosure.

Referring to FIG. 4 and FIG. 5, an package structure 100 of a light-emitting diode (LED) according to an embodiment of this disclosure includes a conductive chip-bonding base board 110, a conductive wire-bonding base board 120, a light-emitting diode chip 130 (LED chip 130), a first wire 141, a second wire 142, and a transparent glue bulk 150.

As shown in FIG. 4, the chip-bonding base board 110 and the wire-bonding base board are made of metal having high electrical conductivity and high thermal conductivity. The chip-bonding base board 110 includes a first bottom surface 112 and a first bottom surface 114, a first glue trough 116 is formed on the first bottom surface 114, and the first glue trough 116 is opened at a first edge 114a of the first bottom surface 114. The wire-bonding base board 120 includes a second top surface 122 and a second bottom surface 124, a second glue trough 126 is formed on the second bottom surface 124, and the second glue trough 126 is opened at a second edge 124a of the second bottom surface 124.

As shown in FIG. 4, the chip-bonding base board 110 and the wire-bonding base board 120 are arranged adjacent to each other, a gap G is formed between the first edge 114a and the second edge 124a, and the first bottom surface 114 and the second bottom surface 124 are coplanar.

As shown in FIG. 4, the LED chip 130 is disposed on the first top surface 112 of the chip-bonding base board 110. The LED chip 130 includes a first electrode 131 and a second electrode 132. The first wire 141 has two ends respectively bonded to the first electrode 131 and the first top surface 112 of the chip-bonding base board 110. The second wire 142 has two ends respectively bonded to the second electrode 132 and the second top surface 122 of the wire-bonding base board 120.

As shown in FIG. 4, furthermore, the package structure 100 further includes at least one reflective layer 160 disposed on an inner wall of the first glue trough 116 or the second glue trough 126.

As shown in FIG. 4, the package structure 100 further includes two welding pads 170 respectively disposed on outer side surfaces of the chip-bonding base board 110 and the wire-bonding base board 120, and respectively exposed on the first bottom surface 114 and the second bottom surface 124. When the first bottom surface 114 and the second bottom surface 124v are attached to a circuit board by surface mount technology (SMT) or other welding process, the two welding pads 170 are connected to the circuit of the circuit board, so as to electrically the first electrode 131 and the second electrode 132 of the LED chip 130 to the circuit board.

As shown in FIG. 5, the transparent glue bulk 150 at least covers parts of the first top surface 112 and the second top surface 122. The transparent glue bulk 150 also wraps the LED chip 130, the first wire 141, and the second wire 142. The transparent glue bulk 150 further extends through the gap G to fill the first glue trough 116 and the second glue trough 126.

When applying a forward bias voltage on the first electrode 131 and the second electrode 132, the LED chip 130 emits light. At this time, the transparent glue bulk 150 serves as a light guide structure, such that light is emitted upward. Meanwhile, transparent glue bulk 150 also guides light to enter the first glue trough 116 and second glue trough 126 through the gap G, such that light is also emitted downward. Therefore, the package structure 100 has an almost 360 degree beam angle. The reflective layer 160 in the first glue trough 116 or the second glue trough 126 is able to enhance brightness of the light downward, and prevent the light from being absorbed by the inner walls of the first glue trough 116 and the second glue trough 126. Furthermore, the chip-bonding base board 110 and the wire-bonding base board 120 are made of metal which has high thermal conductivity to dissipate heat generated by the LED chip 130.

Figure 6:
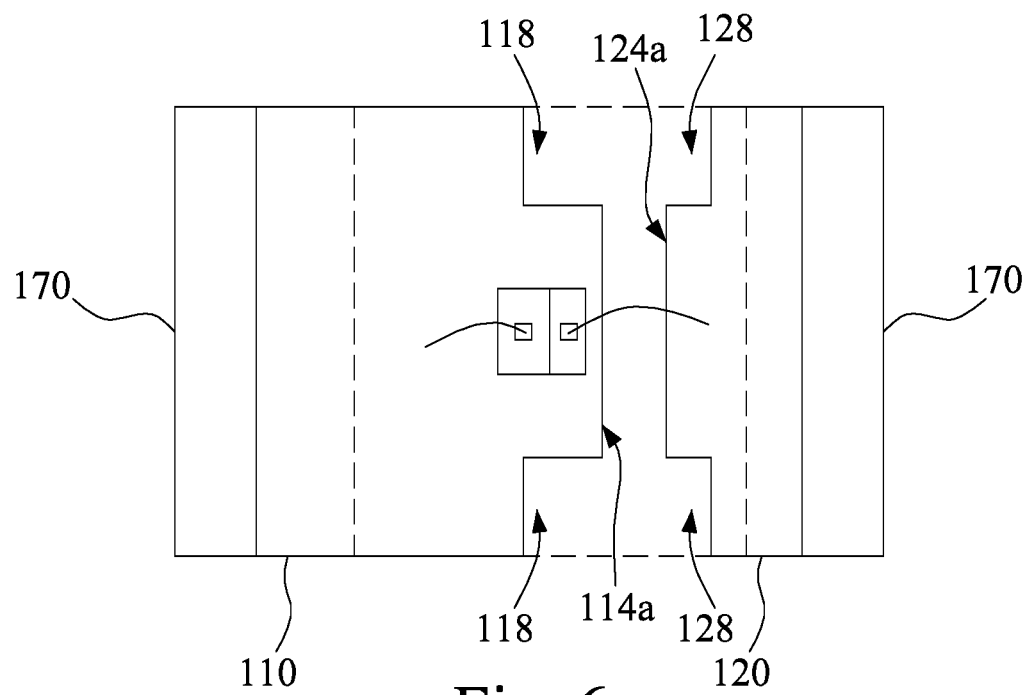
FIG. 6 is top view of the chip-bonding base board and the wire-bonding base board according to the embodiment of this disclosure.

As shown in FIG. 6, in the embodiment of this disclosure, the chip-bonding base board 110 further includes a first notch 118 formed at the first edge 114a and communicating the first top surface 112 and the first glue trough 116. The wire-bonding base board 120 further includes a second notch 128 formed at the second edge 124 and communicating the second top surface 122 and the second glue trough 126. The first notch 118 and the second notch 128 increase area for the light traveling downward, so as to enhance brightness of the light downward.

Figure 7:
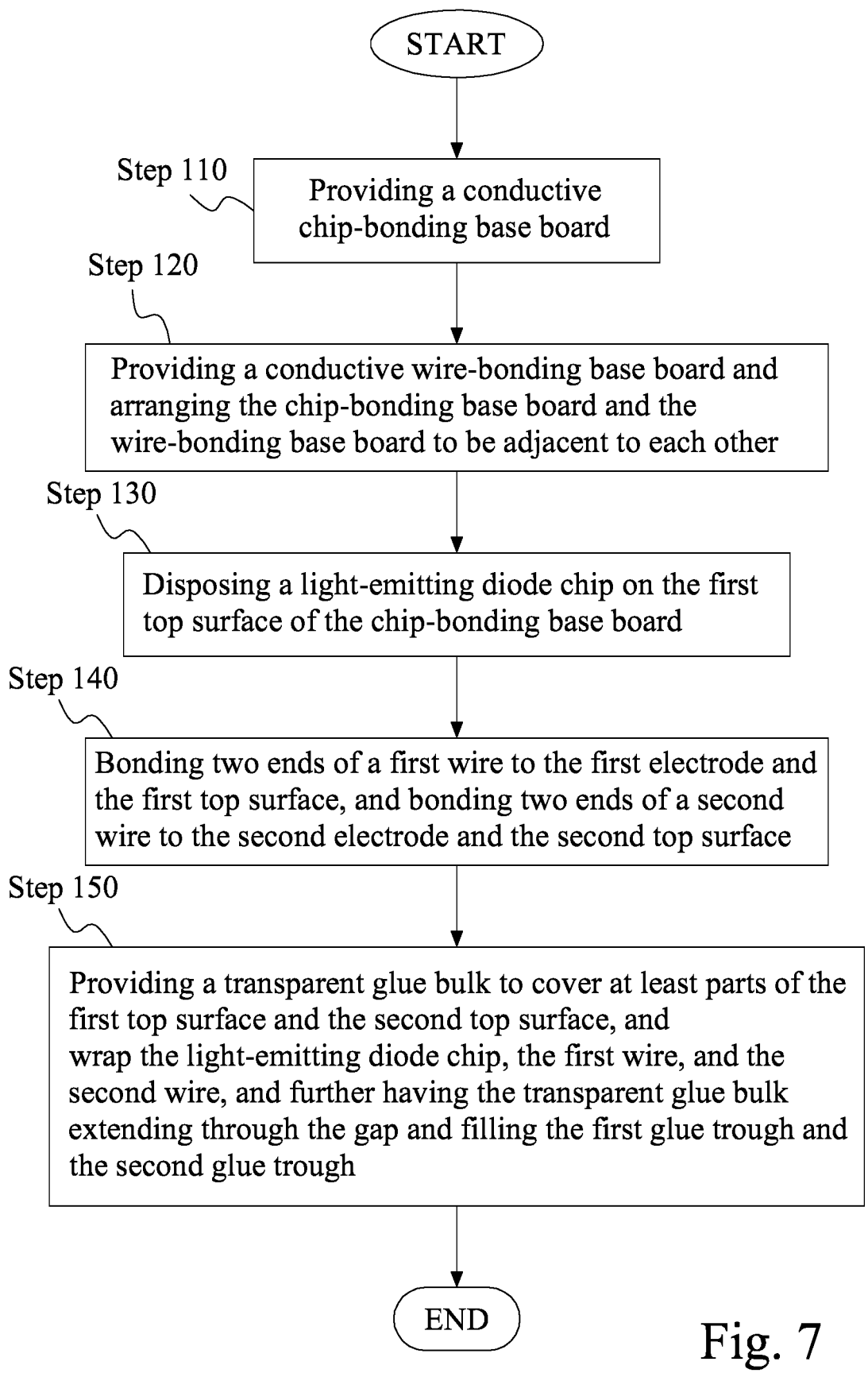
FIG. 7 is a flow chart of the method for packaging the light-emitting diode according to an embodiment of this disclosure.

Referring to FIG. 7, this disclosure further provides a method for packaging a light-emitting diode. The method includes the following steps.

At first, a chip-bonding base board 110 is provided, as shown in Step 110. As shown in FIG. 4, the chip-bonding base board 110 includes a first bottom surface 112 and a first bottom surface 114, a first glue trough 116 is formed on the first bottom surface 114, and the first glue trough 116 is opened at a first edge 114a of the first bottom surface 114.

A wire-bonding base board 120 is provided to arrange the chip-bonding base board 110 and the wire-bonding base board 120 to be adjacent to each other, as shown in Step 120. As shown in FIG. 4, the wire-bonding base board 120 includes a second top surface 122 and a second bottom surface 124, a second glue trough 126 is formed on the second bottom surface 124, and the second glue trough 126 is opened at a second edge 124a of the second bottom surface 124. A gap G is formed between the first edge 114a and the second edge 124a, and the first bottom surface 114 and the second bottom surface 124 are coplanar.

A LED chip 130 is disposed on the first top surface 112 of the chip-bonding base board 110, as shown in FIG. 130. As shown in FIG. 4, the LED chip 130 includes a first electrode 131 and a second electrode 132.

Two ends of a first wire 141 are respectively bonded to the first electrode 131 and the first top surface 112 of the chip-bonding base board 110, and two ends of a second wire 142 are respectively bonded to the second electrode 132 and the second top surface 122 of the wire-bonding base board 120.

Finally, a transparent glue bulk 150 is provided to cover at least parts of the first top surface 112 and the second top surface 122, to wrap the LED chip 130, the first wire 141, and the second wire 142, and to extend through gap G to fill the first glue trough 116 and the second glue trough 126, as shown in Step 150.

In Step 150, the transparent glue bulk 150 is set up by molding, so as to form the transparent glue bulk 150 with a specific configuration on the first top surface 112 and the second top surface 122, and arrange the transparent glue bulk 150 coplanar with the first bottom surface 114 and the second bottom surface 124 when fill the transparent glue bulk 150 into the first glue trough 116 and the second glue trough 126.

In this disclosure, the transparent glue bulk 150 serves as a light guide structure to guide light emitted by the light-emitting diode chip to pass through the gap G and leave the package structure from the first glue trough 116 and second glue trough 126. Therefore, two sides of the package structure emit light to form an almost 360 degree beam angle.

What is claimed is:

1. A package structure of light-emitting diode, comprising:
    a conductive chip-bonding base board, including a first top surface and a first bottom surface;
    wherein a first glue trough is formed on the first bottom surface, and the first glue trough is opened at a first edge of the first bottom surface;
    a conductive wire-bonding base board, including a second top surface and a second bottom surface; wherein a second glue trough is formed on the second bottom surface, and the second glue trough is opened at a second edge of the second bottom surface; wherein the chip-bonding base board and the wire-bonding base board are arranged adjacent to each other, a gap is formed between the first edge and the second edge, and the first bottom surface and the second bottom surface are coplanar;
    wherein the chip-bonding base board further includes a first notch formed at the first edge and communicating with the first top surface and the first glue trough and the wire-bonding base board further includes a second notch formed at the second edge and communicating with the second top surface and the second glue trough;
    a light-emitting diode chip, disposed on the first top surface of the chip-bonding base board, and including a first electrode and a second electrode;
    a first wire, having two ends respectively bonded to first electrode and the first top surface;
    a second wire, having two ends respectively bonded to the second electrode and the second top surface; and
    a transparent glue bulk, at least covering parts of the first top surface and the second top surface, and wrapping the light-emitting diode chip, the first wire, and the second wire;
    wherein the transparent glue bulk further extends through gap and fills the first glue trough and the second glue trough;
    wherein the package structure of light-emitting diode further comprises a reflective layer on an inner wall of the first glue trough and an inner wall of the second glue trough and further comprising:
    two welding pads respectively disposed on outer side surfaces of the chip-bonding base board and the wire-bonding base board, and the surfaces of the chip-bonding base board and the wire-bonding base board, respectively.

2. The package structure of light-emitting diode as claimed in claim 1, wherein a thickness of each of the welding pads is substantially the same as a thickness of the chip-bonding base board or the wire-bonding base board.

3. The package structure of light-emitting diode as claimed in claim 1, wherein the welding pads are not wrapped by the transparent blue bulk.

4. The package structure of light-emitting diode as claimed in claim 1, wherein bottom surfaces of welding pads, the first bottom surface, the second bottom surface and a bottom surface of the transparent blue bulk are coplanar.

5. The package structure of light-emitting diode as claimed in claim 1, further comprising two welding pads respectively disposed on outer side surfaces of the chip-bonding base board and the wire-bonding base board;
    wherein the reflective layer is only on an inner wall of the first glue trough and an inner wall of the second glue trough;
    wherein the welding pads are electrically to and in contact with the outer side surface of the chip-bonding base board and the wire-bonding base board, respectively; a thickness of each of the welding pads is substantially the same as a thickness of the chip-bonding base board or the wire-bonding base board; the welding pads are not wrapped by the transparent blue bulk; and bottom surfaces of welding pads, the first bottom surface, the second bottom surface and a bottom surface of the transparent blue bulk are coplanar; and
    wherein the chip-bonding base board further includes a first notch formed at the first edge and communicating the first top surface and the first glue trough and the wire-bonding base board further includes a second notch formed at the second edge and communicating the second top surface and the second glue trough.

6. A method for packaging light-emitting diode, comprising:
    providing a conductive chip-bonding base board; wherein the chip-bonding base board includes a first bottom surface and a first top surface, a first glue trough is formed on the first bottom surface, and the first glue trough is opened at a first edge of the first bottom surface;
    providing a conductive wire-bonding base board and arranging the chip-bonding base board and the wire-bonding base board to be adjacent to each other; wherein the wire-bonding base board includes a second top surface and a second bottom surface, a second glue trough is formed on the second bottom surface, and the second glue trough is opened at a second edge of the second bottom surface; wherein a gap is formed between the first edge and the second edge, and the first bottom surface and the second bottom surface are coplanar; wherein only an inner wall of the first glue trough and an inner wall of the second trough have a reflective layer thereon;
    disposing a light-emitting diode chip on the first top surface of the chip-bonding base board; wherein the light-emitting diode chip includes a first electrode and a second electrode;
    bonding two ends of a first wire to the first electrode and the first top surface, and bonding two ends of a second wire to the second electrode and the second top surface; and
    providing a transparent glue bulk to cover at least parts of the first top surface and the second top surface, and wrap the light-emitting diode chip, the first wire, and the second wire, and further having the transparent glue bulk extending through the gap and filling the first glue trough and the second glue trough.

* * * * *